United States Patent [19]

Overweg et al.

[11] Patent Number: 4,878,024

[45] Date of Patent: Oct. 31, 1989

[54] MAGNETIC RESONANCE APPARATUS COMPRISING A LOW-NOISE GRADIENT COIL

[75] Inventors: Johannes A. Overweg; Cornelis L. G. Ham, both of Eindhoven, Netherlands

[73] Assignee: U.S. Philips Corporation, New York, N.Y.

[21] Appl. No.: 233,307

[22] Filed: Aug. 17, 1988

[30] Foreign Application Priority Data

Aug. 19, 1987 [NL] Netherlands .................. 8701947

[51] Int. Cl.$^4$ ............................................. G01R 33/20
[52] U.S. Cl. ...................................... 324/319; 335/299
[58] Field of Search ............... 324/300, 307, 318, 319; 335/296, 299, 302, 306

[56] References Cited

U.S. PATENT DOCUMENTS 4,595,900  6/1986  Kamil et al. .................. 335/299

FOREIGN PATENT DOCUMENTS 0152588  12/1984  European Pat. Off. .
2170957A  8/1986  United Kingdom .

*Primary Examiner*—Stewart J. Levy
*Assistant Examiner*—Kevin D. O'Shea
*Attorney, Agent, or Firm*—Thomas A. Briody; Jack E. Haken; Jack D. Slobod

[57] ABSTRACT

In a gradient coil system for a magnetic resonance apparatus arc conductors of notably X coils and Y coils are stacked axially or radially so as to form rigid stacks. The arc conductors are interconnected by means of electrical conductors and the stacks are also interconnected, so that a rigid, self-supporting coil system is obtained. Because the coil system is composed of rigid elements, is comparatively open and does not require a coil former, the production of noise in a magnetic resonance apparatus comprising such a coil system is substantially reduced and field disturbances due to coil deformations are also reduced.

11 Claims, 3 Drawing Sheets

MAGNETIC RESONANCE APPARATUS COMPRISING A LOW-NOISE GRADIENT COIL

BACKGROUND OF THE INVENTION

1. Field of the Invention

The invention relates to a gradient coil system for a magnetic resonance apparatus, comprising coils for generating mutually perpendicularly directed gradient fields, and also relates to a magnetic resonance apparatus comprising such a coil system.

2. Prior Art

A coil system of this kind is known from EP-A-152588. A gradient coil system described therein comprises coils which are pairwise arranged with respect to a symmetry plane of the cylindrical measuring space. In the measuring space a steady magnetic field which is directed along an axial axis, the Z-axis, can be generated. For generating gradients in the field along the Z-axis which are directed mutually perpendicularly and perpendicularly to the Z-axis, coil stacks of a coil pair comprise saddle-shaped coils which are arranged diametrically with respect to one another, viewed azimuthally, and two ring-shaped coil pairs for generating a Z-gradient. The saddle coil stack is combined with the ring-shaped Z-gradient coils in order to form one coil stack by glueing at the area of local mutual overlaps of the coil conductors. Sub-coil systems thus formed can be interconnected by way of axially extending supporting elements, thus forming a complete gradient coil system which is mounted around a coil former by means of insulating, elastic intermediate pieces. This construction aims to reduce the transfer of vibrations from the gradient coils to the coil former, thus reducing the noise in the magnetic resonance apparatus.

Even though the production of noise can thus be reduced, the reduction is limited because strictly fixed positioning of the coil system, notably of the two coil system halves with respect to one another, necessitates comparatively rigid mounting with respect to the coil former. The risk of disorientation of coil parts with respect to one another is increased in that the coils are only locally interconnected, that is to say at the area of mutual overlaps. As a result, the production of vibrations in the coils may still be comparatively high and the ultimate noise level in the apparatus may also be comparatively high.

SUMMARY OF THE INVENTION

It is an object of the invention to mitigate the described drawbacks; to achieve this, a coil system of the kind set forth in accordance with the invention is characterized in that, in conjunction with insulating intermediate rings, coil arcs form rigidly interconnected, ring-shaped stacks which are combined, using interconnections, so as to form a self-supporting coil system.

Using a construction in accordance with the invention, fully self-supporting ring systems can be formed with current-carrying arc conductors which are rigidly clamped between the intermediate rings. The use of the known coil former for the gradient coil system can thus be omitted. Relevant arc conductors are conductively connected to one another and to a current source by means of axially extending current conductors.

In a preferred embodiment, gradient coils for an Xgradient field and gradient coils for a Y-gradient field are accommodated together in one ring stack; this benefits the positioning of the coils with respect to one another and hence the exactness of the gradient fields to be generated.

In a further preferred embodiment, the height/width ratio of the arc conductors is comparatively high, so that the rigidity of each of the elements is increased. For a cylindrical coil system having a diameter of, for example, 75 cm, notably the height of the arc conductors amounts to approximately 40 mm and the width amount to 5 mm. The ring-shaped arc conductors are notably made of a material which is suitably electrically conductive and has a comparatively high modulus of elasticity, for example copper. A comparatively high height/width ratio for ring-shaped arc conductors benefits the rigidity of the coil stacks.

In a further preferred embodiment, the arc conductors are radially stacked instead of axially. An extremely rigid stack can thus be obtained. The arc conductors then preferably consist of cylindrical ring portions having an axial dimension of, for example 50 mm and a radial dimension of, for example 1 mm.

A preferred embodiment of a gradient coil system comprises, for example, from six to ten coil stacks which all have substantially the same inner diameter and which are symmetrically arranged with respect to the central plane of a cylindrical measuring space. Notably the generated surface between the stacks and the connection pieces at least equals the total generated surface of the stacks combined. This results in a comparatively open system so that the transfer of vibrations is minimized. An open construction of this kind can also be realized by means of said radially stacked cylindrical ring portions. Even though each of these portions per se covers a larger surface, the total generated surface need not be increased thereby.

Coil stacks having different internal diameters, for example a larger diameter for stacks situated nearer to the outer side of the cylinder, offer an improvement as regards the accessibility of a patient, or enable the use of a smaller diameter for more centrally located stacks, thus reducing the amount of power supply energy required.

A further preferred embodiment utilizes gradient coils having a mutually different arc length. In the same measuring space a more uniform gradient field can thus be realized by means of a smaller coil volume.

In another preferred embodiment, ring-shaped, or band-shaped arc conductors are complemented so as to form at least substantially closed rings. This can be realized by means of complementary insulator rings which are preferably made of a material having mechanical properties, such as thermal expansion, elasticity modulus etc., which correspond to those of the material of the arc conductors themselves. The arc conductors can also be formed by electrically interrupted closed rings on which electrical contacts for interconnection conductors are provided at the area of the azimuthal boundary of the arcs. These contacts are notably constructed as sliding contacts, so that the gradient fields to be generated can be tuned as if it were.

For an axial stacking in a further preferred embodiment the intermediate pieces have a larger or smaller diameter at one radial side, so that the arc conductors are electrically shielded at the relevant side, for example from the axial conductors. For the axial conductors recesses can also be provided in the insulating intermediate rings.

In a further preferred embodiment intermediate pieces, and possibly also arc conductors, are provided with recesses and projections for selected radial and/or azimuthal mutual positioning.

In a further embodiment, conductor stacks are rigidly connected to a supporting cylinder having a diameter which deviates from the diameter of the stacks, its diameter preferably being larger. As a result, simple, reliable and firm mounting is possible. The conductors form, for example ridges on an inner surface of a supporting cylinder. Because the energy generated is proportional to the fifth power of the radius of the conductor arc, a smaller radius results in a substantial efficiency improvement because of the mounting on the inner side of the supporting cylinder. Because the supporting cylinder is now situated outside the conductors, it can be constructed to be thicker and hence more rugged, but notably also so that the suppression of noise is better.

BRIEF DESCRIPTION OF THE DRAWING

Some preferred embodiments in accordance with the invention will be described in detail hereinafter with reference to the drawing. In the drawing.

DETAILED DESCRIPTION OF THE PREFERRED EMBODIMENTS

Figure 1:
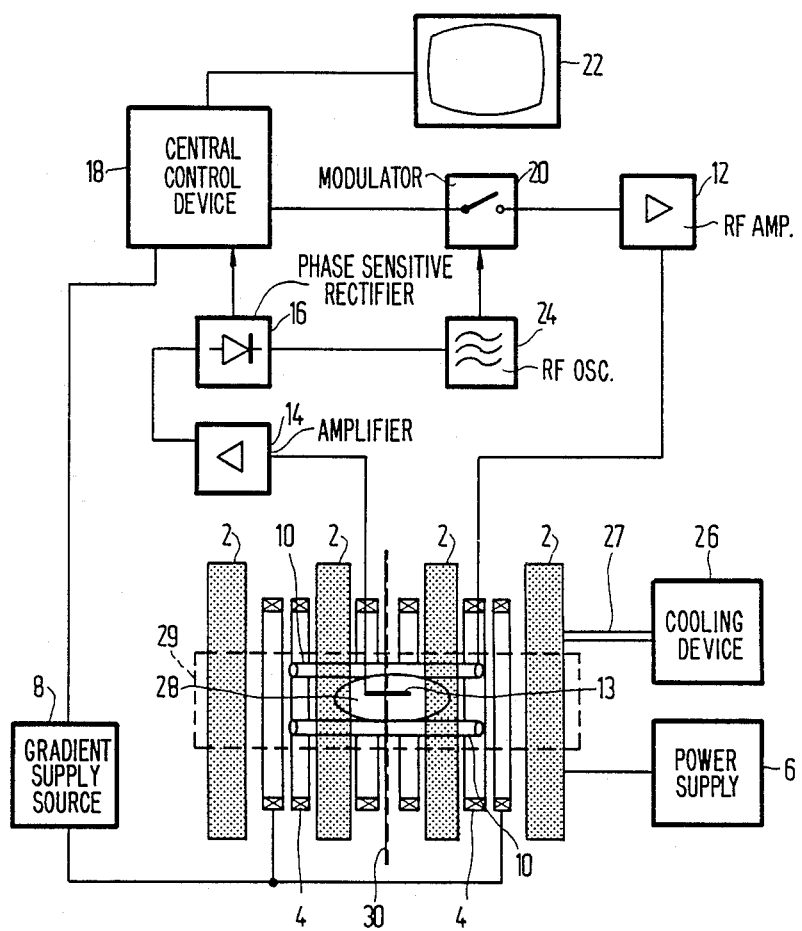
FIG. 1 shows a magnetic rsonance apparatus comprising a coil system in accordance with the invention.

A magnetic resonance apparatus as shown in FIG. 1 comprises a magnet system 2 for generating a steady, uniform magnetic field, a magnet system 4 for generating magnetic gradient fields, and power supply sources 6 and 8 for the magnet system 2 and the magnet system 4, respectively. A magnet coil 10 serves to generate an RF magnetic alternating field and is connected to cable 11 providing a source of RF output from an RF amplifier 12. For the detection of magnetic resonance signals generated by the RF transmitted field in an object to be examined there is included a surface coil 13. For read purposes, the coil 13 is connected to a signal amplifier 14. The signal amplifier 14 is connected to a phase sensitive rectifier 16 which is connected to a central control device 18. The central control device 18 controls a modulator 20 for feeding the RF amplifier 12, and also controls the power supply source 8 for the gradient coils, and a monitor 22 for display. An RF oscillator 24 controls the modulator 20 as well as the phase sensitive rectifier 16 which processes the measuring signals. A cooling device 26 comprising cooling ducts 27 is provided for cooling purposes, if desired. A cooling device of this kind can be constructed as a water cooling system for resistance coils or as a liquid helium system or nitrogen dewar system for cooled superconducting coils. The transmitter coil 10 which is arranged within the magnet systems 2 and 4 encloses a measuring space 28 which offers adequate space for accommodating patients in the case of an apparatus for medical diagnostic measurements. Thus, there can be generated within the measuring space 28 a steady magnetic field, gradient fields for position selection of slices to be imaged and a spatially uniform RF alternating field.

The gradient magnet system 4 is symmetrically arranged with respect to a radial symmetry plane 30 in a conventional manner, which plane thus divides also the measuring space symmetrically into two parts and is directed through a point $Z=0$, transversely of a Z axis of the steady magnet system. The steady magnetic field generated by the steady magnet system, therefore, is directed along the Z-axis. A gradient magnet system in a magnetic resonance apparatus usually comprises a coil system for each of the coordinate directions, activation of said coil systems enabling the generating of gradient fields in each of said directions and also the point-wise imaging of an object. The coil systems for the X-gradient and the Y-gradient in a gradient coil system in accordance with the invention are also substantially identical, but rotated through 90° with respect to one another, viewed azimuthally. The difference may be imposed by the construction of the entire coil system; for example, in the case of radial stacking the radius may deviate slightly and in the case of axial stacking the Z location may deviate slightly.

Figure 2:
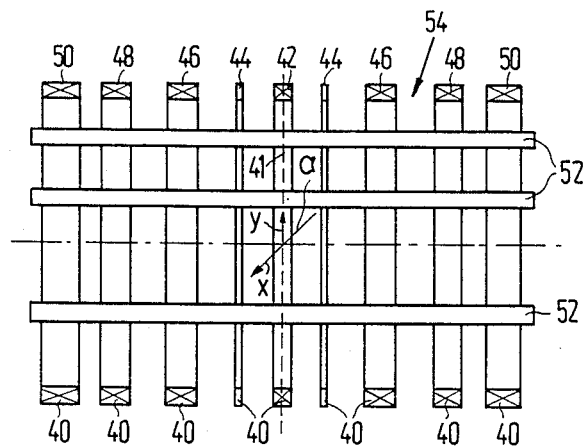
FIG. 2 is an axial sectional view of a preferred embodiment of a coil system for such an apparatus.

A coil system as shown in FIG. 2 comprises nine coil stacks 40 which are symmetrically oriented with respect to an X-Y plane 41 through $Z=0$. In this embodiment, a first coil stack 42 for X-Y gradient fields is situated in the symmetry plane and comprises, for example four arc conductors, two of which serve for an X-gradient field and two for a Y-gradient field. Proceeding from the symmetry plane 41, a next stack pair 44 in this case comprises only one or more Z-gradient arc conductors, a next stack pair 46 comprises, for example stacks with seven X gradient arc conductors and seven Y-gradient arc conductors, a next stack pair 48 comprises only Z-gradient arc conductors again, and a stack pair 50 comprises, for example nine arc conductors which act as return conductors for said X and nine arc conductors which act as return conductors for said Y gradient arc conductors. As has already been stated, the arc conductors for the X and Y fields need not necessarily extend through mutually the same arc angles. The stacks 42-50 are rigidly interconnected by means of axial connection rods 52, thus forming a rugged, self-supporting gradient coil system which is comparatively open, viewed in a generated surface 54, about the Z-axis where it covers, for example at the most from one fifth to one half of the surface area. In order to realize an as open as possible system, arc conductors for axially stacked stacks are preferably constructed so as to be comparatively high, the height being understood to mean herein the difference in the radial dimension between the inner side and the outer side. The width, being the axially measured dimension, may then be comparatively small. As a result of this design, an open as well as an extremely rigid construction can be realized.

Figure 3:
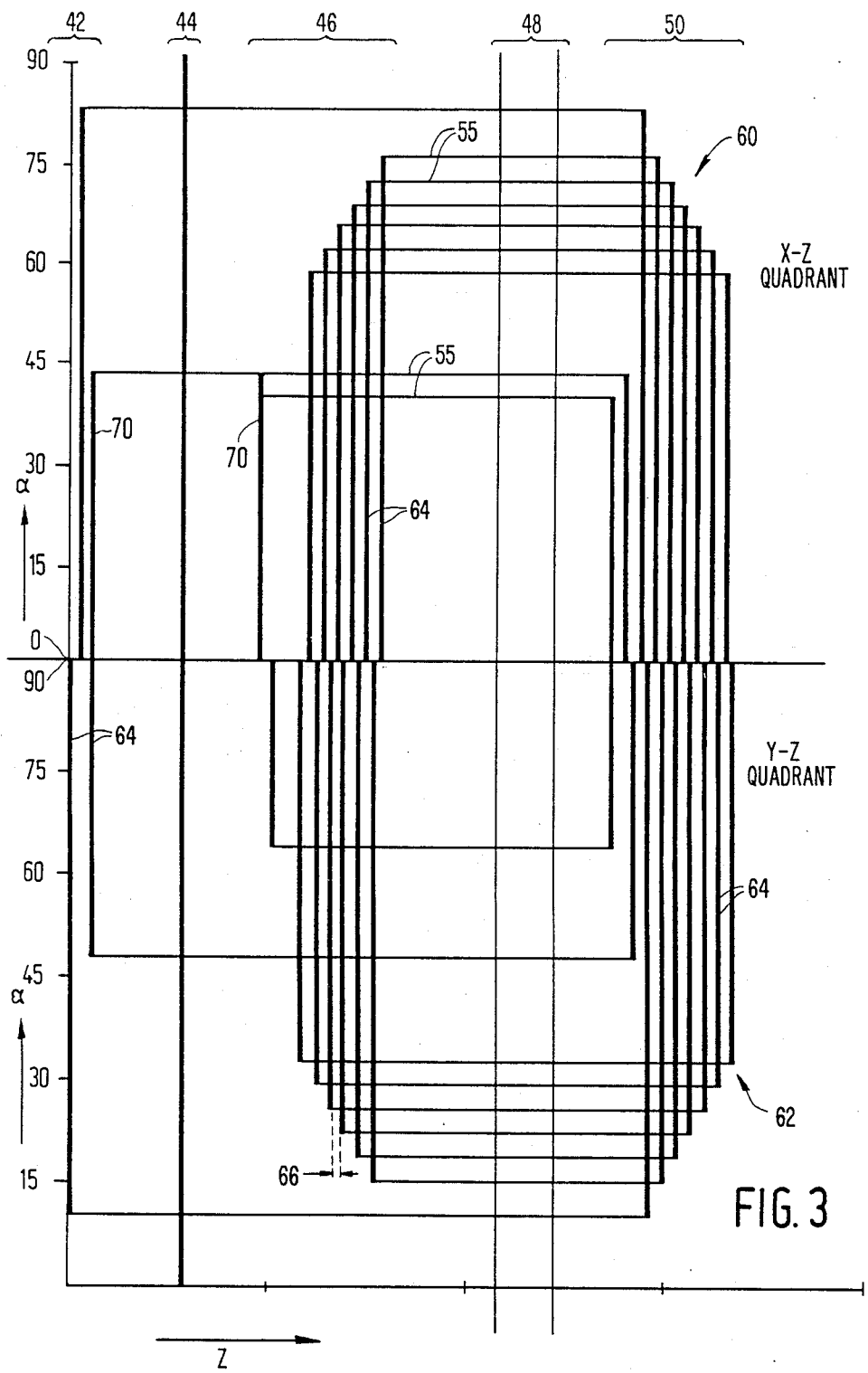
FIG. 3 shows a lay-out of the arc conductors for this coil system.

FIG. 3 diagrammatically illustrates the lay-out of arc conductors 64 in the various stacks, wherein the arc conductors are illustrated as comparatively heavy vertical lines. There are further illustrated a quadrant 60 for X-Z conductors and a quadrant 62 for Y-Z conductors, which quadrants, however, do not form the same quadrant on the cylinder surface 54 of the coil system but are azimuthally shifted 90° with respect to one another at that area. Because the coil system is symmetrical with respect to the X-Y symmetry plane 41 (FIG. 2) through $Z=0$ and with respect to a plane through the Z-axis, the entire system of coils is thus defined. In FIG. 3, the horizontal axis coincides with the Z-axis and the vertical axis extending perpendicularly thereto represents the angle α from 0° to 90°, as indicated in FIG. 2. The mutually interleaved positioning of X and Y arc conductors is expressed by showing these conductors to be shifted at the separation α=0° and α=90° with respect to one another. Where no interleaving occurs, because each of the arc conductors extends through less than 90°, arc conductors are situated exactly opposite one another in the same plane. Between the arc conductors 64 clearances 66 are formed for said spacer rings.

Similar to FIG. 2, arc conductors of the stacks 42 to 50 are shown, the Z-gradient field stacks 44 and 48 being continuous rings, each of which can comprise more or less conductors (not separately shown). The arc conductors of the stacks 42 and 46 are connected to return arc conductors of the stack 50 by means comprising axially directed conductors 55 which are not subject to high Lorentz forces and which do not contribute to the formation of the gradient fields, so that they need not have an adapted construction or orientation. As has already been stated, these conductors can be connected to the arc conductors via electrical connections which are possibly constructed as sliding contacts. The positioning of the necessary axial connections can be adapted, if necessary, to the location of at least a part of these axial conductors.

Figure 4:
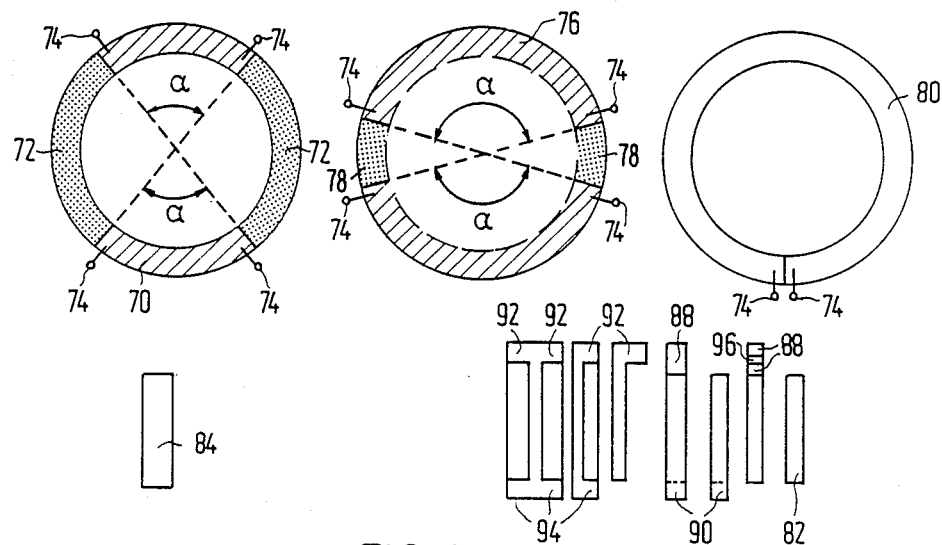
FIG. 4 shows various shapes of arc conductors to be axially stacked for such a coil system.

FIG. 4 shows some shapes of arc conductors for axial stacking in accordance with the invention. An arc conductor 70 of an X or Y gradient coil extends through an angle α of, for example less than 90°; for example, see the arc conductor 70 in FIG. 3. Remaining portions 72 of the ring can be filled, if necessary, with an insulating material or the conductor can cover the entire ring, electrical contacts 74 then determining the arc length. Therefore, for these arc conductors interleaving need not be used. An arc conductor 76 extends through an angle α of, for example 160° with complementary spaces or filling pieces 78. Interlining then occurs upon stacking. A ring-shaped element 80 can actually represent a Z-gradient ring as well as an intermediate ring of an insulating material. In the case of a Z-gradient ring, electrical contacts 74 are again provided and the cross-section of the ring can be locally adapted to relevant requirements. In the case of an insulating intermediate ring, a cross-section 82 is shown which is adapted, as far as the height is concerned, to the height of a crosssection 84 of an arc conductor and which is constructed to be comparatively thin in order to save space. An intermediate ring can be provided with an extension 88 or 90 on one side in order to ensure suitable shielding from the arc conductors at that side. Alternatively, an intermediate ring can be provided with extensions 88 and 90 on both sides, which extensions may comprise axially projecting edges 92 and 94, respectively, which enclose the arc conductors. These extensions can be provided with recesses 96 for the positioning of the axial conductors. The arc conductors as well as the intermediate rings can be provided with recesses or projections ensuring exact axial, radial and azimuthal positioning.

Figure 5:
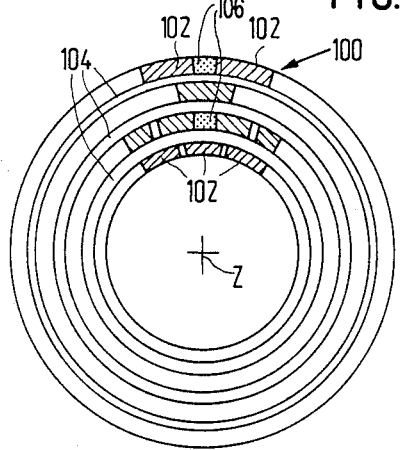
FIG. 5 shows an embodiment of a radially stacked coil for such a coil system.

FIG. 5 is a sectional view of an embodiment of a radially stacked stack 100, comprising arc conductors 102 which are shaped as a metal foil bent about a Z axis for example, on an insulating cylindrical substrate 106. When arc conductors and the radially intermediate rings 104 used for stacking, which intermediate rings are more cylindrical, are made of a magnetic material, arcs which are in this case situated further inwards wil not disturb the field of arcs which are situated further outwards and a suitably defined gradient field can be generated in the measuring space. The advantage of this form of stacking consists in that the arc conductors form strips of metal foil which can be readily cut from a plate withless loss of material and which can be bent so as to obtain the desired radius of curvature. The conductors or the insulators of the stack can also be readily pictured in order to provide the necessary electrical conductors, without the field being disturbed. Adaptation to the height of stacks comprising a different number of conductors can be realized, if desired, by means of an insulating material.

What is claimed is:

1. A self-supporting gradient coil system for generating mutually perpendicularly directed gradient fields in a generally cylindrical measurement space, said system comprising a plurality of axially spaced-apart ring-shaped stacks of arc conductors, each stack comprising a plurality of arc conductors and insulating rings intermediate said arc conductors, and axially directed means for rigidly interconnecting said stacks.

2. A gradient coil system as claimed in claim 1, characterized in that said arc conductors are in the form of comparatively narrow ring segments which are axially stacked with said intermediate insulating intermediate rings, to form said ring-shaped stacks.

3. A gradient coil system as claimed in claim 1, characterized in that said arc conductors are in the form of comparatively wide ring segments which are radially stacked, with said intermediate insulating rings, to form said ring-shaped stacks.

4. A gradient coil system as claimed in claim 1, 2 or 3, characterized in that arc conductors for X-gradient fields and arc conductors for Y-gradient fields are interleaved in said ring-shaped stacks.

5. A gradient coil system as claimed in claim 1, 2 or 3, characterized in that a radial dimension of a cross-section of each of said arc conductors is at least a factor 5 greater than an axial dimension of each said arc conductor.

6. A gradient coil system as claimed in claim 1, 2 or 3, characterized in that an axial dimension of a cross-section of each of said arc conductors is at least approximately a factor 5 greater than an radial dimension of each said arc conductor.

7. A gradient coil system as claimed in claim 1, characterized in that the arc conductors are made of an electrically conductive material having a comparatively high modulus of elasticity.

8. A gradient coil system as claimed in claim 1, 2 or 3, characterized in that said arc conductors for X-Y gradient coils form at least a substantially closed ring constructed of complementary electrically insulating and electrically conductive material.

9. A gradient coil system as claimed in claim 1 characterized in that electrical connections for conductive connections between arc conductors are constructed so as to be azimuthally adjustable.

10. A gradient coil system as claimed in claim 1, characterized in that intermediate rings and/or arc conductors are provided with recesses and/or projections for a fixed radial, axial and/or azimuthal mutual positioning for stacking.

11. A gradient coil system as claimed in claim 1, characterized in that said ring stacks are rigidly connected to a supporting cylinder having a diameter which deviates from that of the ring stacks.

* * * * *